(12) United States Patent
Wu et al.

(10) Patent No.: US 9,177,498 B2
(45) Date of Patent: Nov. 3, 2015

(54) DISPLAY PANEL

(71) Applicant: E Ink Holdings Inc., Hsinchu (TW)

(72) Inventors: Chi-Liang Wu, Hsinchu (TW); Po-Hsin Lin, Hsinchu (TW); Chin-Wen Lin, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 19 days.

(21) Appl. No.: 14/076,282

(22) Filed: Nov. 11, 2013

(65) Prior Publication Data

US 2014/0225882 A1        Aug. 14, 2014

(30) Foreign Application Priority Data

Feb. 8, 2013   (TW) .............................. 102105391 A (51) Int. Cl.
*G09G 3/20*     (2006.01)
*G09G 3/36*     (2006.01)
*G11C 19/00*    (2006.01)

(52) U.S. Cl.
CPC ................ *G09G 3/20* (2013.01); *G09G 3/3677* (2013.01); *G09G 2310/0267* (2013.01); *G09G 2310/0286* (2013.01); *G11C 19/00* (2013.01)

(58) Field of Classification Search
CPC ........... G11C 19/00; G09G 2310/0267; G09G 2310/0286; G09G 3/20; G09G 3/3677
USPC ............... 377/64; 345/92, 100, 204, 211, 212
See application file for complete search history.

(56) References Cited

U.S. PATENT DOCUMENTS

| | | | |
|---|---|---|---|
| 5,701,136 A * | 12/1997 | Huq et al. | ...................... 345/100 |
| 7,310,402 B2 | 12/2007 | Wei et al. | |
| 7,474,138 B2 | 1/2009 | Tsuchi et al. | |
| 8,049,706 B2 | 11/2011 | Tsou | |
| 8,207,725 B2 | 6/2012 | Sullivan et al. | |
| 2008/0219401 A1 | 9/2008 | Tobita | |
| 2009/0066260 A1 | 3/2009 | Sugimoto | |
| 2009/0115802 A1 | 5/2009 | Nakanishi et al. | |
| 2010/0188385 A1 | 7/2010 | Boiko | |

(Continued)

FOREIGN PATENT DOCUMENTS

| | | |
|---|---|---|
| TW | 200739504 | 10/2007 |
| TW | 200951907 | 12/2009 |

OTHER PUBLICATIONS

Corresponding TW Office Action that these art references were cited.

*Primary Examiner* — Lun-Yi Lao
*Assistant Examiner* — Kelly B Hegarty
(74) *Attorney, Agent, or Firm* — CKC & Partners Co., Ltd.

(57) ABSTRACT

A display panel includes a gate driving circuit and a control circuit. The gate driving circuit includes a plurality of circuit stages. An Nth-circuit stage of the circuit stages includes a start unit, a drive unit, a first pull-down unit, a second pull-down unit, and a current detecting unit. The drive unit is configured to provide a dock signal to an Nth-output terminal. The first pull-down unit is configured to make an enable node have a first pull-down voltage. The second pull-down unit is configured to provide a disable node with a second pull-down voltage. The current detecting unit is configured to detect an error current passing through the first pull-down unit and output an error signal according to the error current. The control circuit is configured to adjust the second pull-down voltage according to the error signal of the Nth-circuit stage.

11 Claims, 4 Drawing Sheets

(56) References Cited

U.S. PATENT DOCUMENTS

2011/0080385 A1* 4/2011 Kitagishi ................. 345/204
2011/0157112 A1   6/2011 Shibata et al.
2012/0105393 A1   5/2012 Tan et al.
2013/0044854 A1* 2/2013 Yonemaru et al. ............ 377/64
2014/0091997 A1* 4/2014 Han et al. ..................... 345/92

* cited by examiner

DISPLAY PANEL

RELATED APPLICATION

This application claims priority to Taiwan Application Serial Number 102105391, filed Feb. 8, 2013, which is herein incorporated by reference.

BACKGROUND

1. Field of Invention

The present invention relates to an electronic device. More particularly, the present invention relates to a display panel.

2. Description of Related Art

With the rapid development of science and technology, a display panel has already been applied in the life of people widely, such as mobile phones or computers and the like.

The display panel may include a gate driving circuit, a data driving circuit and a plurality of pixels arranged as a matrix. The gate driving circuit may include a plurality of circuit stages electrically connected in series. The gate driving circuit can generate a plurality of gate signals (scanning signals) sequentially through the circuit stages, and provide the gate signals to the pixels so as to open the pixels by columns/rows sequentially. A data driver can generate a plurality of source signals (data signals), and provide the source signals to the opened pixels so that the display states (such as color and gray scale) of the opened pixels can be updated. Therefore, images can be updated and displayed on the display panel.

Generally, each circuit stage of the gate driving circuit may include a plurality of switches (such as thin film transistors). The gate driving circuit can sequentially turn on and off the switches of plural circuit stages to generate gate signals of the plural circuit stages. However, after the switches are operated at a high temperature or driven for long time, the threshold voltage will deviate, resulting in that the switches cannot be turned on or turned off correctly. When specific switches cannot be turned on or turned off correctly, the gate driving circuit cannot output the gate signals correctly, resulting in the instability of the display panel.

Therefore, it is an important research topic of the field how to design a more stable display panel, to detect and correct the incorrect turn on or off of the specific switches in the gate driving circuit, so that the gate driving circuit can output the gate signals correctly.

SUMMARY

An aspect of the present invention is a display panel.

According to an embodiment of the present invention, the display panel includes a gate driving circuit and a control circuit. The gate driving circuit includes a plurality of circuit stages. The circuit stages are electrically connected in series. An Nth-circuit stage of the circuit stages includes a start unit, a drive unit, a first pull-down unit, a second pull-down unit and a current detecting unit. The start unit is configured to receive and provide a start pulse signal to an enable node, and make the enable node have an enable voltage. The drive unit is configured to receive a clock signal and provide the clock signal to an Nth-output terminal according to the enable voltage of the enable node. The first pull-down unit is configured to provide a first pull-down voltage to the enable node according to a supply voltage of a disable node, and make the enable node have the first pull-down voltage. The second pull-down unit is configured to provide a second pull-down voltage to the disable node according to the enable voltage of the enable node. The current detecting unit is configured to detect an error current passing through the first pull-down unit, and output an error signal according to the error current. The control signal is configured to receive the error signal of the Nth-circuit stage, and adjust the second pull-down voltage according to the error signal.

According to another embodiment of the present invention, the current detecting unit includes a current mirror. The current mirror is configured to receive the error current and reflect a reflected current corresponding to the error current.

According to yet another embodiment of the present invention, the current detecting unit further includes a converter. The converter is configured to receive the reflected current and output the error signal corresponding to the reflected current.

According to still yet another embodiment of the present invention, the control circuit includes at least one control switch. The control switch is configured to provide an alternative second pull-down voltage to the Nth-circuit stage as the second pull-down voltage of the Nth-circuit stage according to the error signal of the Nth-circuit stage.

According to an embodiment of the present invention, the Nth-circuit stage further includes a third pull-down unit. The third pull-down unit is configured to provide the first pull-down voltage to the Nth-output terminal according to the supply voltage of the disable node.

According to another embodiment of the present invention, the Nth-circuit stage further includes a fourth pull-down unit. The fourth pull-down unit is configured to receive the start pulse signal, and provide the first pull-down voltage to the disable node according to the start pulse signal.

According to yet another embodiment of the present invention, a pull-up unit is further configured to receive a reset signal, and provide the supply voltage to the disable node according to the reset signal.

According to still yet another embodiment of the present invention, the enable node has the first pull-down voltage under a first state. Under a second state, the start unit receives the start pulse signal, provides the start pulse signal to the enable node, and makes the enable node have the enable voltage, so that the second pull-down unit provides the second pull-down voltage to the disable node. Under a third state, the start unit stops providing the start pulse signal to the enable node. Under a fourth state, the drive unit receives the clock signal and provides the clock signal to the Nth-output terminal. Under a fifth state, the drive unit stops receiving the clock signal and providing the clock signal to the Nth-output terminal.

Another aspect of the present invention is another display panel.

According to an embodiment of the present invention, the display panel includes a gate driving circuit and a control circuit. The gate driving circuit includes a plurality of circuit stages. The circuit stages are electrically connected in series. An Nth-circuit stage of the circuit stages includes a capacitor, a first pull-up switch, a start switch, a drive switch, a first pull-down switch, a second pull-down switch, a reset switch, a current mirror and a converter. The capacitor has a first terminal and a second terminal, and the second terminal of the capacitor is electrically connected with an Nth-output terminal. The first pull-up switch is electrically connected between the first terminal of the capacitor and a supply voltage, and configured to be controlled by the supply voltage. The start switch is electrically connected between the first terminal of the capacitor and a start pulse signal, and configured to be controlled by the start pulse signal. The drive switch is electrically connected between the second terminal of the capacitor and a clock signal, and configured to be controlled by the voltage of the first terminal of the capacitor. The first pull-down switch is electrically connected between the first terminal of the capacitor and a first pull-down voltage, and configured to be controlled by the voltage of a disable node. The second pull-down switch is electrically connected between the disable node and a second pull-down voltage, and configured to be controlled by the voltage of the first terminal of the capacitor. The reset switch is electrically connected between the first terminal of the capacitor and a first pull-down voltage, and configured to be controlled by a reset signal. The current mirror is electrically connected with the first pull-down switch and configured to receive an error current passing through the first pull-down switch and reflect a reflected current corresponding to the error current. The converter is electrically connected with the current mirror, and configured to receive the reflected current and output an error signal corresponding to the reflected current. The control circuit is configured to receive the error signal of the Nth-circuit stage and adjust the second pull-down voltage according to the error signal.

According to another embodiment of the present invention, the control circuit includes at least one control switch. The control switch is configured to provide an alternative second pull-down voltage to the Nth-circuit stage as the second pull-down voltage of the Nth-circuit stage according to the error signal of the Nth-circuit stage.

According to another embodiment of the present invention, the display panel further includes a third pull-down switch electrically connected between the second terminal of the capacitor and the first pull-down voltage, configured to conduct the second terminal of the capacitor C and the first pull-down voltage, and configured to be controlled by the voltage of the disable node.

According to another embodiment of the present invention, the display panel further includes a fourth pull-down switch electrically connected between the disable node and the first pull-down voltage, configured to conduct the disable node and the first pull-down voltage, and configured to be controlled by the start pulse signal.

According to another embodiment of the present invention, the display panel further includes a second pull-up switch electrically connected between the supply voltage and the disable node, configured to conduct the supply voltage and the disable node, and configured to be controlled by the reset signal.

In view of the above, through application of one of the aforesaid aspects, when an error (for example, the first pull-down switch is turned on incorrectly) occurs in the first pull-down unit of any one of the circuit stages that the error current passes through the first pull-down unit of the circuit stage, the display panel can generate the error signal of the circuit stage to the control circuit through the current detecting unit, such that the control circuit can accordingly adjust (for example reduce) the second pull-down voltage. As such, even when an error occurs in the first pull-down unit that the error current passes through the first pull-down unit of the circuit stage, the gate driving circuit can still operate correctly.

Furthermore, through the application of the other one of the aforesaid aspects, when an error occurs in the first pull-down switch of any one of the circuit stages that the error current passes through the first pull-down switch of the circuit stage, the display panel can generate the error signal of the circuit stage to the control circuit through the current mirror, such that the control circuit can accordingly adjust (for example reduce) the second pull-down voltage. As such, even when an error occurs in the first pull-down switch and the error current passes through the first pull-down switch of the circuit stage, the gate driving circuit can still operate correctly.

DETAILED DESCRIPTION

The spirit of the present invention will be described clearly through the drawings and the detailed description as follows. Any of those of ordinary skills in the art can make modifications and variations from the technology taught in the present invention after understanding the embodiments of the present invention, without departing from the sprite and scope of the present invention.

The phrases "first", "second" . . . used in herein are neither intended to specifically designate a sequence or order nor intended to limit the present invention, and are only used to identify elements or operations described through the same technical terms.

Additionally, the phrase "electrically connecting" used herein refers to that two or more elements physically or electrically contact with each other directly or indirectly, or refer to that two or more elements inter-operate or interact with each other.

Figure 1:
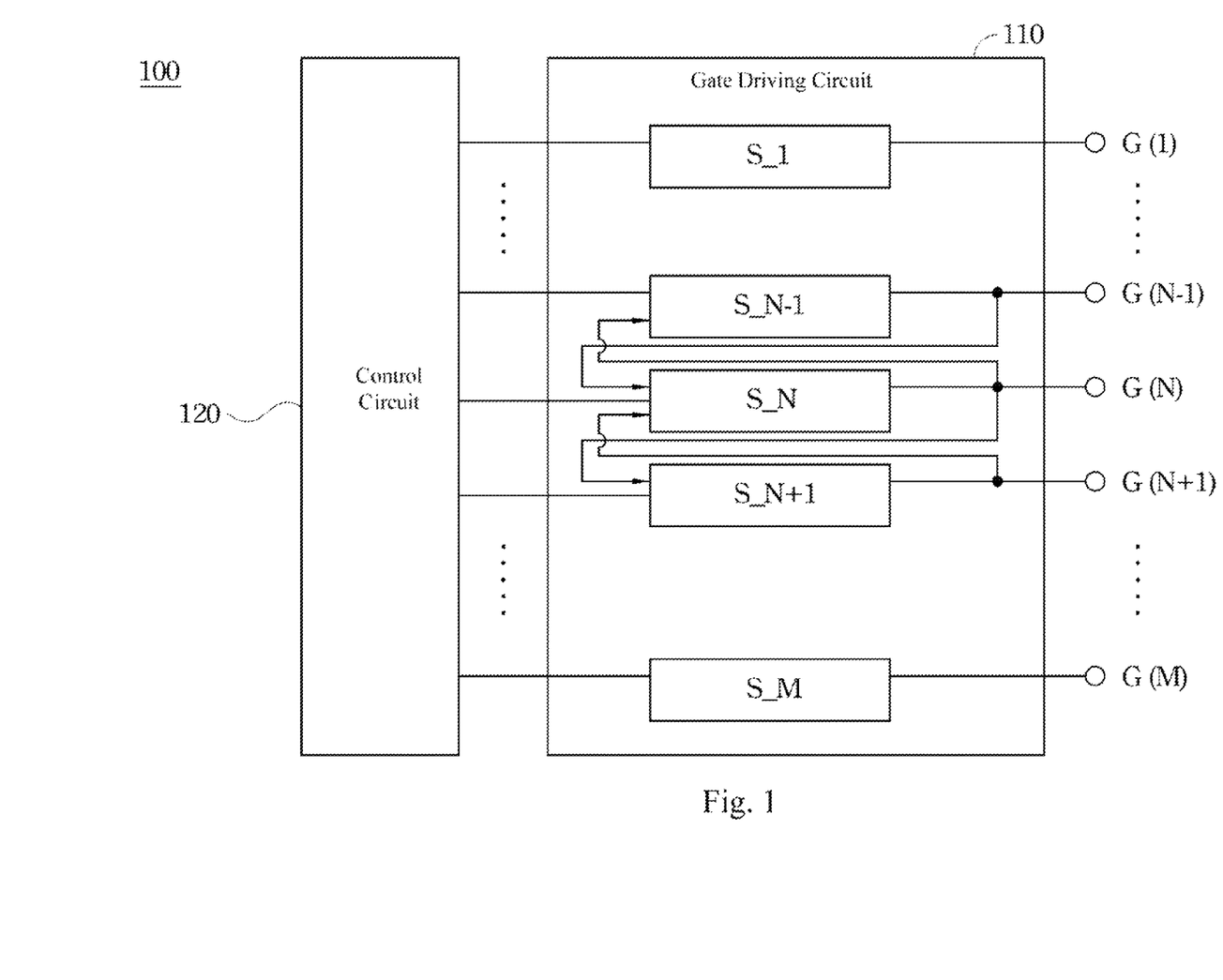
FIG. 1 is a schematic diagram of a display panel illustrated according to an embodiment of the present invention.

FIG. 1 is a schematic diagram of a display panel 100 illustrated according to an embodiment of the present invention. The display panel 100 may include a gate driving circuit 100, a control circuit 120, a data driving circuit (not shown) and a plurality of pixels (not shown) arranged as a matrix. The gate driving circuit 110 may be electrically connected with the control circuit 120 and the plural columns/rows of pixels. The gate driving circuit 110 may provide a plurality of scanning signals to the plural columns/rows of pixels sequentially so that the pixels are opened by columns/rows sequentially. The control circuit 120 may provide a voltage (for example the second pull-down voltage LVGL) to the gate driving circuit 110. A data driver may generate a plurality of source signals (data signals), and provide the source signals to the opened pixels, so that the display conditions (such as color and gray scale) of the opened pixels are updated.

The gate driving circuit 110 may include a plurality of circuit stages, for example the circuit stages S_1, . . . , S_N−1, S_N, S_N+1, . . . , S_M, wherein M and N are positive integers. The gate driving circuit 110 may be connected with the plural columns/rows of pixels through the output terminals of the circuit stages S_1, . . . , S_N−1, S_N, S_N+1, . . . , S_M, for example the output terminals G(1), . . . , G(N−1), G(N), G(N+1), . . . , G(M), and provide the scanning signals to the plural columns/rows of pixels in order. For example, during an (N−1)th period, the gate driving circuit 110 may provide the scanning signal (for example high voltage level) to the (N−1) column/row of pixels through the (N−1)th output terminal G(N−1) of the circuit stage S_N−1 During an Nth period, the gate driving circuit 110 may provide the scanning signal to the Nth column/row of pixels through the Nth-output terminal G(N) of the circuit stage S_N.

Additionally, each circuit stage of the gate driving circuit 110, i.e., S_1, ..., S_N−1, S_N, S_N+1, ..., S_M, can be further configured to provide the error signals ERR_1, ..., ERR_N−1, ERR_N, ERR_N+1, ..., ERR_M to the control circuit 120 in the occurrence of special errors. The control circuit 120 can be configured to receive the error signals ERR_1, ..., ERR_N−1, ERR_N, ERR_N+1, ..., ERR_M of the circuit stages S_1, ..., S_N−1, S_N, S_N+1, ..., S_M, and adjust the voltage (for example the second pull-down voltage LVGL) provided to the circuit stages S_1, ..., S_N−1, S_N, S_N+1, ..., S_M according to at least one of the error signals ERR_1, ..., ERR_N−1 ERR_N, ERR_N+1, ..., ERR_M of the circuit stages S_1, ..., S_N−1, S_N, S_N+1, ..., S_M, such that the gate driving circuit 110 can be recovered to operate normally.

In order to make descriptions clear and easy to learn, the Nth-circuit stage S_N is taken as an example for illustrating the setting of one of the circuit stages S__1, ..., S_N−1, S_N, S_N+1, ..., S_M in the following.

Figure 2:
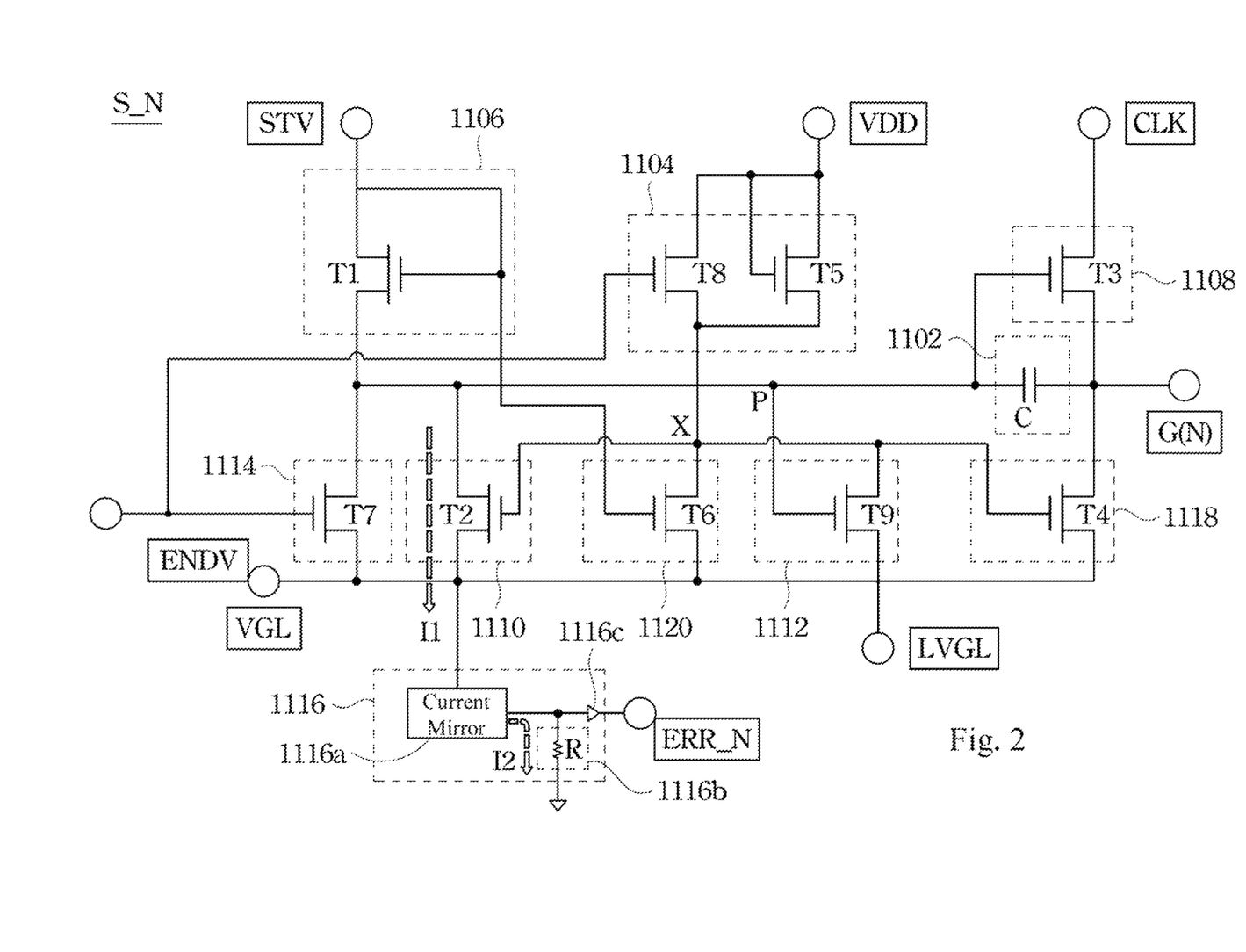
FIG. 2 is a schematic diagram of an Nth-circuit stage illustrated according to an embodiment of the present invention.

FIG. 2 is a schematic diagram of an Nth-circuit stage S_N illustrated according to an embodiment of the present invention. The Nth-circuit stage S_N, for example, may include a charge-discharge unit 1102, a pull-up unit 1104, a start unit 1106, a drive unit 1108, a first pull-down unit 1110, a second pull-down unit 1112, a reset unit 1114 and a current detecting unit 1116.

The charge-discharge unit 1102 may be electrically connected between an enable node P and the Nth-output terminal G(N). The pull-up unit 1104 may be electrically connected between a supply voltage VDD and a disable node X. The start unit 1106 may be electrically connected between a start pulse signal STV and the enable node P. The start pulse signal STV, for example, may be electrically connected with the output terminal (i.e., the output terminal G(N−1)) of the previous circuit stage (i.e., the (N−1)th-circuit stage S_N−1). The drive unit 1108 may be electrically connected between a clock signal CLK and the Nth-output terminal G(N). The first pull-down unit 1110 may be electrically connected between the disable node X and the first pull-down voltage VGL. The second pull-down unit 1112 may be electrically connected between the disable node X and the second pull-down voltage LVGL. The reset unit 1114 may be electrically connected between the enable node P and the first pull-down voltage VGL. The current detecting unit 1116 may be electrically connected with the first pull-down unit 1110 and the control unit 120. The output terminal G(N) may be electrically connected with the start pulse signal STV of the next circuit stage (i.e., the (N+1)th-circuit stage S_N+1) and the reset signal ENDV of the previous circuit stage (i.e., the (N−1)th-circuit stage S_N−1).

The pull-up unit 1104 may be configured to receive the supply voltage VDD (for example the high voltage level), and provide the voltage to the disable node X.

The start unit 1106 may be configured to receive the start pulse signal STV (for example the high voltage level) (for example the scanning signal output by the previous circuit stage (i.e., the (N−1)th-circuit stage S_N−1)), and provide the start pulse signal STV to the charge-discharge unit 1102 and the enable node P, so as to charge the charge-discharge unit 1102, and to make the enable node P have the enable voltage (for example the high voltage level).

The drive unit 1108 may be configured to receive the clock signal CLK, and provide the clock signal CLK (for example the high voltage level) to the Nth-output terminal G(N) as the scanning signal output by the Nth-circuit stage S_N according to the enable voltage of the enable node P. For example, if the enable node P has the enable voltage, the drive unit 1108 may provide the clock signal CLK to the Nth-output terminal G(N) when receiving the clock signal CLK. Additionally, when the enable node P does not have the enable voltage (for example, the enable node has the first pull-down voltage VGL) (for example the enable node P has the low voltage level), the drive unit 1108 does not provide the clock signal CLK to the Nth-output terminal G(N).

The first pull-down unit 1110 may be configured to provide the first pull-down voltage VGL (for example the low voltage level) to the charge-discharge unit 1102 and the enable node P according to the supply voltage VDD of the disable node X, and make the enable node P have the first pull-down voltage VGL. For example, when the disable node X has the supply voltage VDD, the first pull-down unit 1110 may provide the first pull-down voltage VGL to the charge-discharge unit 1102 and the enable node P. When the enable node P does not have the supply voltage VDD (for example the enable node P has the first pull-down voltage VGL or the second pull-down voltage LVGL) (for example the enable node P has the low voltage level), the first pull-down unit 1110 does not provide the first pull-down voltage VGL to the charge-discharge unit 1102 and the enable node P.

The second pull-down unit 1112 may be configured to provide the second pull-down voltage LVGL to the disable node X according to the enable voltage of the enable node P. For example, when the enable node P has the enable voltage, the second pull-down unit 1112 may provide the second pull-down voltage LVGL to the disable node X. When the enable node P does not have the enable voltage, the second pull-down unit 1112 does not provide the second pull-down voltage LVGL to the disable node X.

The reset unit 1114 may be configured to receive the reset signal ENDV (for example the high voltage level) (for example the scanning signal output by the next circuit stage (i.e., the (N+1)th-circuit stage S_N+1)), and provide the first pull-down voltage VGL to the charge-discharge unit 1102, so as to discharge the charge-discharge unit 1102, and make the enable node P have the first pull-down voltage VGL. For example, when the reset signal ENDV is received, the reset unit 1114 provides the first pull-down voltage VGL to the charge-discharge unit 1102. When no reset signal ENDV is received (for example reset unit 1114 receives the low voltage level), the reset unit 1114 does not provide the first pull-down voltage VGL to the charge-discharge unit 1102.

The current detecting unit 1116 may be configured to detect the error current I1 passing through the first pull-down unit 1110 and output the error signal ERR_N (for example the high voltage level) of the Nth-circuit stage S_N according to the error current I1. For example, when detecting the error current I1 of the first pull-down unit 1110 (for example the error current I1 is greater than a current threshold), the current detecting unit 1116 may output the error signal ERR_N of the Nth-circuit stage S_N.

Through the above configuration, the display panel 100 can be realized. In the display panel 100, under the condition that the enable node P of any one of the circuit stages has the enable voltage, so that the disable node X has the second pull-down voltage LVGL, if an error occurs in the first pull-down unit 1110 (for example the switch therein are turned on incorrectly) such that the error current I1 passes through the first pull-down unit 1110 of the circuit stage, the current detecting unit 1116 can detect the error current I1 and output the error signal of the circuit stage to the control circuit 120. When receiving the error signal, the control circuit 120 can adjust (for example reduce) the second pull-down voltage LVGL. Therefore, even when an error occurs in the first pull-down unit 1110 such that the error current I1 passes through the first pull-down unit 11110 of the circuit stage, the gate driving circuit 110 can still operate correctly.

More details of the display panel 100 are provided in the following according to an embodiment of the present invention. However, the present invention is not limited to the following embodiment.

In an embodiment of the present invention, the charge-discharge unit 1102, for example, may include a capacitor C. The capacitor C, for example, may have a first terminal and a second terminal. The first terminal may be electrically connected with the enable node P, and the second terminal may be electrically connected with the Nth-output terminal G(N).

The pull-up unit 1104, for example, may include a first pull-up switch T5. The pull-up switch T5, for example, may be electrically connected between the first terminal of the capacitor C and the supply voltage VDD, so as to conduct the first terminal of the capacitor C and the supply voltage VDD. The pull-up switch T5 can be controlled by the supply voltage VDD.

The start unit 1106, for example, may include a start switch T1. The start switch T1, for example, may be electrically connected between the first terminal of the capacitor C and the start pulse signal STV, so as to conduct the first terminal of the capacitor C and the start pulse signal SW. The start switch T1 can be controlled by the start pulse signal STV.

The drive unit 1108, for example, may include a drive switch T3. The drive switch T3, for example, may be electrically connected between the second terminal of the capacitor C and the clock signal CLK, so as to conduct the second terminal of the capacitor C and the clock signal CLK. The drive switch T3 can be controlled by the voltage of the first terminal of the capacitor C.

The first pull-down unit 1110, for example, may include a first pull-down switch T2. The first pull-down switch T2 may be electrically connected between the first terminal of the capacitor C and the first pull-down voltage VGL, so as to conduct the first terminal of the capacitor C and the first pull-down voltage VGL. The first pull-down switch T2 can be controlled by the voltage of the disable node X.

The second pull-down unit 1112, for example, may include a second pull-down switch T9. The second pull-down unit 1112 may be electrically connected between the disable node X and the second pull-down voltage LVGL, so as to conduct the disable node X and the second pull-down voltage LVGL. The second pull-down unit 1112 can be controlled by the voltage of the first terminal of the capacitor C.

The reset unit 1114, for example, may include a reset switch T7. The reset switch T7 may be electrically connected between the first terminal of the capacitor C and the first pull-down voltage VGL, so as to conduct the first terminal of the capacitor C and the first pull-down voltage VGL. The reset switch T7 can be controlled by the reset signal ENDV.

Additionally, in an embodiment, the aforesaid switches, for example, may consist of thin film transistors.

Through the above configuration, in a case that the enable node P of any one of the circuit stages has the enable voltage so that the disable node X has the second pull-down voltage LVGL, if the threshold voltage Vth of the first pull-down switch T2 of the first pull-down unit 1110 deviates (for example the threshold voltage Vth is reduced), such that the threshold voltage Vth is less than or equal to a voltage that subtracting the first pull-down voltage VGL from the second pull-down voltage LVGL (i.e., Vth≤LVGL−VGL), then the first pull-down switch T2 is turned on, the voltage of the enable node P is pulled down, and the circuit stage cannot output the scanning signal of the circuit stage correctly. At this moment, through the configuration of the current detecting unit 1116 and the control circuit 120, when the current detecting unit 1116 of the circuit stage detects the error current I1 and outputs the error signal of the circuit stage to the control circuit 120, the control circuit 120 may adjust (for example reduce) the second pull-down voltage LVGL, so as to make the threshold voltage Vth be greater than the value subtracting the first pull-down voltage VGL from the adjusted threshold voltage LVGL (i.e., Vth>LVGL−VGL), and make the first pull-down switch T2 be turned off. As such, even when the threshold voltage Vth of the first pull-down switch T2 deviates, the gate driving circuit 110 can still operated correctly.

In an embodiment of the present invention, the current detecting unit 1116 of the Nth-circuit stage S_N may include a current mirror 1116a, a converter 1116b and a buffer 1116c. The current mirror 1116a is electrically connected with the converter 1116b and the buffer 1116c. The current mirror 1116a, for example, may be a basic current mirror, a cascode current mirror, a Wilson current mirror or other conventional current mirrors. The converter 1116b, for example, may include a resistor R or other conventional current-voltage conversion elements. The current mirror 1116a may be configured to receive the error current I1 passing through the first pull-down unit 1110 (for example, passing through the first pull-down switch T2), and reflect a reflected current I2 corresponding to the error current I1. The converter 1116b may be configured to receive the reflected current I2 and provide the error signal ERR_N to the buffer 1116c corresponding to the reflected current I2. The buffer 1116c may be configured to buffer and output the error signal ERR_N. It should be noted that, in practice, the reflected current I2 also can be used as the error signal output to the control circuit 120 and in such a configuration, the converter 1116b and the buffer 1116c may both be omitted. Accordingly, the present invention is not limited to the embodiment above mentioned.

In an embodiment of the present invention, the Nth-circuit stage S_N further includes a third pull-down unit 1118. The third pull-down unit 1118 is configured to provide the first pull-down voltage VGL to the Nth-output terminal G(N) and the second terminal of the capacitor C according to the supply voltage of the disable node X, so as to reset the capacitor C. For example, when the enable node P has the supply voltage VDD, the third pull-down unit 1118 may provide the first pull-down voltage VGL to the Nth-output terminal G(N). When the enable node P does not have the supply voltage VDD, the third pull-down unit 1118 does not provide the first pull-down voltage VGL to the Nth-output terminal G(N).

In an embodiment, the third pull-down unit 1118 includes a third pull-down switch T4. The third pull-down switch T4 may be electrically connected between the second terminal of the capacitor C and the first pull-down voltage VGL, so as to conduct the second terminal of the capacitor C and the first pull-down voltage VGL. The third pull-down switch 14 can be controlled by the voltage of the disable node X.

In an embodiment of the present invention, the Nth-circuit stage S_N further includes a fourth pull-down unit 1120. The fourth pull-down unit 1120 is configured to provide the first pull-down voltage VGL to the disable node X according to the start pulse signal STV, and be used as a discharge path of the disable node X. For example, when the start pulse signal STV is received, the fourth pull-down unit 1120 may provide the first pull-down voltage VGL to the disable node X. When no start pulse signal STV is received, the fourth pull-down unit 1120 does not provide the first pull-down voltage VGL to the disable node X.

In an embodiment, the fourth pull-down unit 1120 includes a fourth pull-down switch T6. The fourth pull-down switch T6 may be electrically connected between the disable node X and the first pull-down voltage VGL, so as to conduct the disable node X and the first pull-down voltage VGL. The fourth pull-down switch T6 can be controlled by the start pulse signal STV.

In an embodiment of the present invention, the pull-up unit 1104 of the to Nth-circuit stage S_N is further configured to receive the reset signal ENDV, provide the supply voltage VDD to the disable node X according to the reset signal ENDV, and be used as the charge path of the disable node X. For example, when receiving the reset signal ENDV, the pull-up unit 1104 provides the supply voltage VDD to the disable node X. When receiving no reset signal ENDV, the pull-up unit 1104 does not provide the supply voltage VDD to the disable node X.

In an embodiment, the pull-up unit 1104 further includes a second pull-up switch T8. The second pull-up switch T8 may be electrically connected between the supply voltage VDD and the disable node X, so as to conduct the supply voltage VDD and the disable node X. The second pull-up switch T8 can be controlled by the reset signal ENDV.

In order to make the present invention be easier to learn, the operation of the Nth-circuit stage S_N in an embodiment will be described in reference with FIG. 2 and FIG. 3 as follows.

Figure 3:
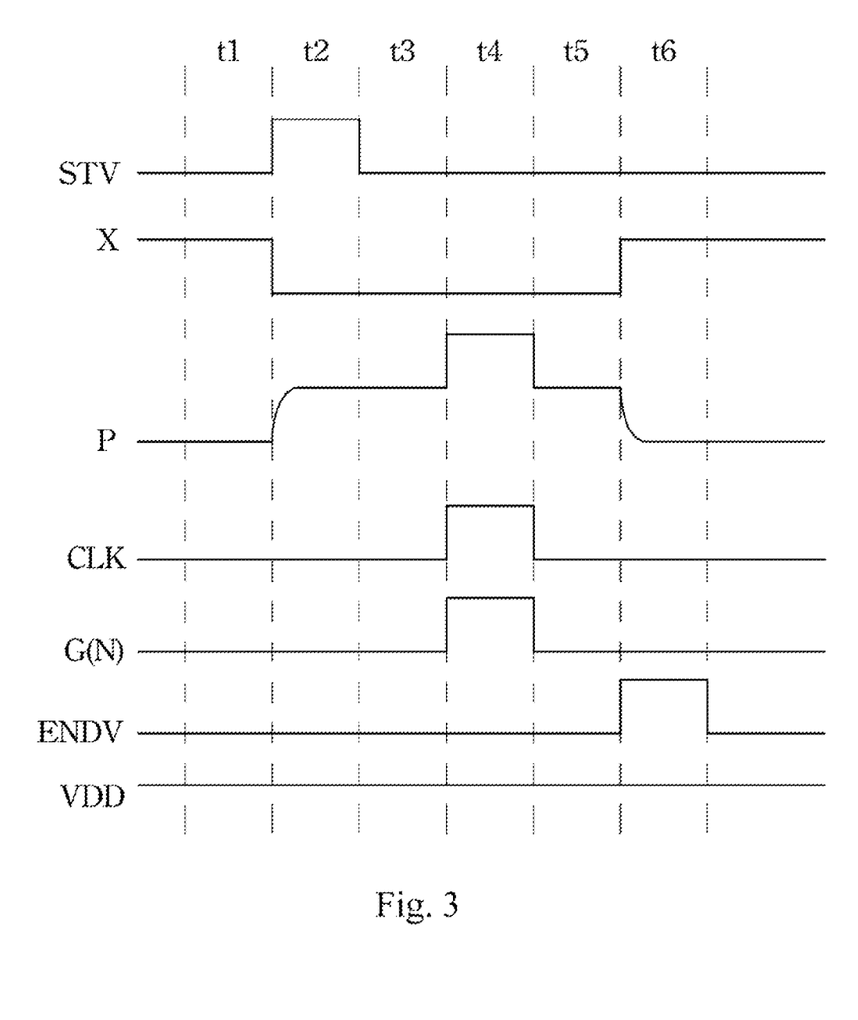
FIG. 3 is a state sequence chart of the Nth-circuit stage illustrated according to an embodiment of the present invention.

FIG. 3 is a state sequence chart of the Nth-circuit stage S_N illustrated according to yet an embodiment of the present invention.

Under the t1 state, the pull-up switch T5 is turned on by receiving the supply voltage VDD, so that the pull-up unit 1104 provides the supply voltage VDD to the disable node X. Correspondingly, the first pull-down switch T2 is turned on, so that the first pull-down unit 1110 provides the first pull-down voltage VGL to the charge-discharge unit 1102 (for example, the first terminal of the capacitor C). As such, the enable node P has the first pull-down voltage VGL. In addition, the third pull-down switch T4 is turned on, so that the third pull-down unit 1118 provides the first pull-down voltage VGL to the charge-discharge unit 1102 (for example, the second terminal of the capacitor C) and the Nth-output terminal G(N).

Under the t2 state, the switch T1 is turned on by receiving the start pulse signal STV, so that the start unit 1106 provides the start pulse signal STV to the charge-discharge unit 1102 and the enable node P, making that the enable node P has the enable voltage. Correspondingly, the second pull-down switch T9 is turned an, so that the second pull-down unit 1112 provides the second pull-down voltage LVGL to the disable node X. Correspondingly, the first pull-down switch T2 and the third pull-down switch T4 are turned off. Additionally, the drive switch T3 is turned on, so that the drive unit 1108 provides the clock signal CLK to the Nth-output terminal G(N) when receiving the clock signal CLK. Additionally, the fourth pull-down switch T6 is turned on by receiving the start pulse signal SW, so that the fourth pull-down unit 1120 provides the first pull-down voltage VGL to the disable node X.

Under the t3 state, the start switch T1 is turned off as stopping receiving the start pulse signal STV, so that the start unit 1106 stops providing the start pulse signal SW to the charge-discharge unit 1102 and the enable node P. At this moment, the enable node P still has the enable voltage. Therefore, the drive switch T3 and the second pull-down switch T9 are still turned on. Additionally, the fourth pull-down switch T6 is turned off as stopping receiving the start pulse signal STV.

Under the t4 state, the drive unit 1108 receives the clock signal CLK and provides the clock signal CLK to the Nth-output terminal G(N) as the scanning signal output by the Nth-circuit stage S_N.

Under the t5 state, the drive unit 1108 stops receiving the clock signal CLK and providing the clock signal CLK to the Nth-output terminal G(N). Moreover, the Nth-circuit stage S_N stops outputting the scanning signal.

Under the t6 state, the reset switch T7 is turned on as receiving the reset signal ENDV, so that the reset unit 1114 provides the first pull-down voltage VGL to the charge-discharge unit 1102, making that the enable node P has the first pull-down voltage VGL. Correspondingly, the drive switch T3 is turned off. In addition, the second pull-down switch T9 is turned off, such that the second pull-down unit 1112 stops providing the second pull-down voltage LVGL to the disable node X. As such, the disable node X has the supply voltage VDD, such that the first pull-down switch T2 and the third pull-down switch T4 are turned on, and making the capacitor C be reset.

In the above embodiments, under the states t2 to t5, if the threshold voltage Vth of the first switch T2 is deviated such that the first switch T2 is turned on, the current detecting unit 1116 can output the error signal ERR_N to the control circuit 120, so as to make the control circuit 120 adjust the second pull-down voltage LVGL. As such, the circuit stage S_N can operate normally.

Figure 4:
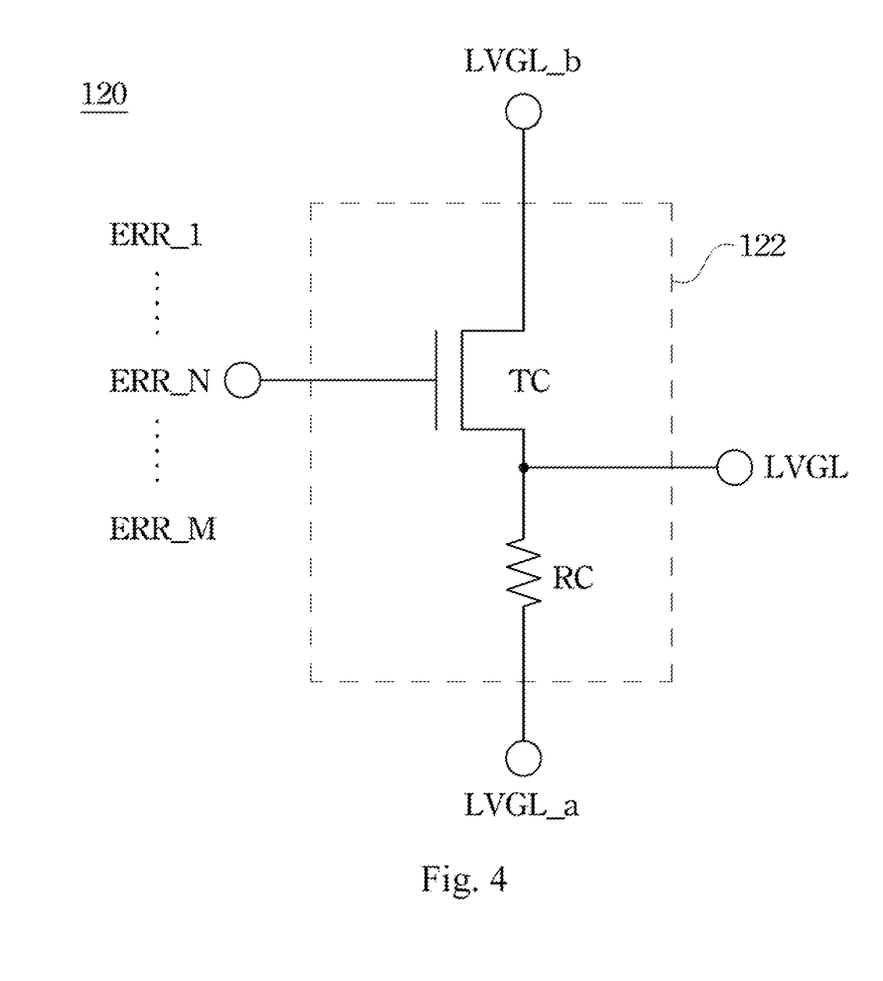
FIG. 4 is a schematic diagram of a control circuit illustrated according to an embodiment of the present invention.

FIG. 4 is a schematic diagram of the control circuit 120 illustrated according to an embodiment of the present invention. The control circuit 120 may include at least one control switch 122. The control switch 122, for example, may include a control transistor TC and a control resistor RC. The control switch 122 may be configured to provide the alternative second pull-down voltage LVGL_b to the circuit stages S_1, . . . , S_N−1, S_N, S_N+1, . . . , S_M as the second pull-down voltage LVGL of the circuit stages S_1, . . . , S_N−1, S_N, S_N+1, . . . , S_M according to the error signals ERR_1, . . . , ERR_N−1, ERR_N, ERR_N+1, . . . , ERR_M of the circuit stages S_1, . . . , S_N−1, S_N, S_N+1, . . . , S_M. For example, when no one of the error signals ERR_1, . . . , ERR_N−1, ERR_N, ERR_N+1, . . . , ERR_M is received, the control switch 122 provides the default second pull-down voltage LVGL_a to the circuit stages S_1, . . . , S_N−1, S_N, S_N+1, . . . , S_M. When any one of the error signals ERR_1, . . . , ERR_N−1, ERR_N, ERR_N+1, . . . , ERR_M is received, the control switch 122 provides the alternative second pull-down voltage LVGL_b to the circuit stages S_1, . . . , S_N−1, S_N, S_N+1, . . . , S_M.

In an embodiment of the present invention, the alternative second pull-down voltage LVGL_b, for example, is lower than the default second pull-down voltage LVGL_a.

Additionally, in an embodiment of the present invention, the control circuit 120 also may respectively provide the alternative second pull-down voltage LVGL_b to the circuit stages S_1, . . . , S_N−1, S_N, S_N+1, . . . , S_M as the second pull-down voltage LVGL of the circuit stages S_1, . . . , S_N−1, S_N, S_N+1, . . . , S_M according to the error signals ERR_1, . . . , ERR_N−1, ERR_N, ERR_N+1, . . . , ERR_M of the circuit stages S_1, . . . , S_N−1, S_N, S_N+1, . . . , S_M. For example, when receiving the error signal ERR_1 output by the circuit stage S_1, the control circuit 120 provides the alternative second pull-down voltage LVGL_b to the circuit stage S_1 as the second pull-down voltage LVGL, and keeps providing the default second pull-down voltage LVGL_a to other circuit stages S_2, ..., S_N−1, S_N, S_N+1, ..., S_M as the second pull-down voltage LVGL.

Although the present invention has been disclosed with reference to the above embodiments, the embodiments are not intended to limit the present invention. It will be apparent to those skilled in the art that various modifications and variations can be made without departing from the scope or spirit of the present invention. Therefore, the scope of the present invention shall be defined by the appended claims.

What is claimed is:

1. A display panel, comprising:
a gate driving circuit, comprising:
a plurality of circuit stages, wherein the circuit stages are electrically connected in series and an Nth-circuit stage of the circuit stages comprises:
a start unit configured to receive and provide a start pulse signal to an enable node, and make the enable node have an enable voltage;
a drive unit configured to receive a clock signal, and provide the clock signal to an Nth-output terminal according to the enable voltage of the enable node;
a first pull-down unit configured to provide a first pull-down voltage to the enable node according to a supply voltage of a disable node, and make the enable node have the first pull-down voltage;
a second pull-down unit configured to provide a second pull-down voltage to the disable node according to the enable voltage of the enable node; and
a current detecting unit configured to detect an error current passing through the first pull-down unit, and output an error signal according to the error current, wherein the current detecting unit comprises a current mirror and the current mirror is configured to receive the error current and reflect a reflected current corresponding to the error current; and
a control circuit configured to receive the error signal of the Nth-circuit stage and adjust the second pull-down voltage according to the error signal, wherein the control circuit is directly connected to the second pull-down unit.

2. The display panel of claim 1, wherein the current detecting unit further comprises a converter and the converter is configured to receive the reflected current and output the error signal corresponding to the reflected current.

3. The display panel of claim 1, wherein the control circuit comprises at least one control switch and the control switch is configured to provide an alternative second pull-down voltage to the Nth-circuit stage as the second pull-down voltage of the Nth-circuit stage according to the error signal of the Nth-circuit stage.

4. The display panel of claim 1, wherein the Nth-circuit stage further comprises:
a third pull-down unit configured to provide the first pull-down voltage to the Nth-output terminal according to the supply voltage of the disable node.

5. The display panel of claim 1, wherein the Nth-circuit stage further comprises:
a fourth pull-down unit configured to receive the start pulse signal, and provide the first pull--down voltage to the disable node according to the start pulse signal.

6. The display panel of claim 1, wherein a pull-up unit is further configured to receive a reset signal, and provide the supply voltage to the disable node according to the reset signal.

7. The display panel of claim 1, wherein the enable node has the first pull-down voltage under a first state;

under a second state, the start unit receives the start pulse signal, and provides the start pulse signal to the enable node to make the enable node have the enable voltage, so that the second pull-down unit provides the second pull-down voltage to the disable node;
under a third state, the start unit stops providing the start pulse signal to the enable node;
under a fourth state, the drive unit receives the clock signal and provides the clock signal to the Nth-output terminal; and
under a fifth state, the drive unit stops receiving the clock signal and providing the clock signal to the Nth-output terminal.

8. A display panel, comprising:
a gate driving circuit, comprising:
a plurality of circuit stages, wherein the circuit stages are electrically connected in series; and an Nth-circuit stage of the circuit stages comprises:
a capacitor, having a first terminal and a second terminal, wherein the second terminal of the capacitor is electrically connected with an Nth-output terminal;
a first pull-up switch electrically connected between the first terminal of the capacitor and a supply voltage, and the first pull-up switch configured to be controlled by the supply voltage;
a start switch electrically connected between the first terminal of the capacitor and a start pulse signal, and the start switch configured to be controlled by the start pulse signal;
a drive switch electrically connected between the second terminal of the capacitor and a clock signal, and the drive switch configured to be controlled by the voltage of the first terminal of the capacitor;
a first pull-down switch electrically connected between the first terminal of the capacitor and a first pull-down voltage, and the first pull-down switch configured to be controlled by the voltage of a disable node;
a second pull-down switch electrically connected between the disable node and a second pull-down voltage, and the second pull-down switch configured to be controlled by the voltage of the first terminal of the capacitor;
a reset switch electrically connected between the first terminal of the capacitor and a first pull-down voltage, and the reset switch configured to be controlled by a reset signal;
a current mirror electrically connected with the first pull-down switch, and the current mirror configured to receive an error current passing through the first pull-down switch and reflect a reflected current corresponding to the error current; and
a converter electrically connected with the current mirror, and the converter configured to receive the reflected current and output an error signal corresponding to the reflected current; and
a control circuit configured to receive the error signal of the Nth-circuit stage and adjust the second pull-down voltage according to the error signal, wherein the control circuit is directly connected to the second pull-down unit,
wherein the control circuit comprises at least one control switch and the control switch is configured to provide an alternative second pull-down voltage to the Nth-circuit stage as the second pull-down voltage of the Nth-circuit stage according to the error signal of the Nth-circuit stage.

9. The display panel of claim 8, further comprising a third pull-down switch, electrically connected between the second terminal of the capacitor and the first pull-down voltage, wherein the third pull-down switch is configured to conduct the second terminal of the capacitor and the first pull-down voltage, and the third pull-down switch is controlled by the voltage of the disable node.

10. The display panel of claim 9, further comprising a fourth pull-down switch, electrically connected between the disable node and the first pull-down voltage, wherein the fourth pull-down switch is configured to conduct the disable node and the first pull-down voltage, and the fourth pull-down switch is controlled by the start pulse signal.

11. The display panel of claim 8, further comprising a second pull-up switch, electrically connected between the supply voltage and the disable node, wherein the second pull-up switch is configured to conduct the supply voltage and the disable node, and the second pull-up switch is controlled by the reset signal.

* * * * *